(12) United States Patent
Choi

(10) Patent No.: US 9,202,532 B2
(45) Date of Patent: Dec. 1, 2015

(54) BURST SEQUENCE CONTROL AND MULTI-VALUED FUSE SCHEME IN MEMORY DEVICE

(75) Inventor: Myung Chan Choi, San Jose, CA (US)

(73) Assignee: WINBOND ELECTRONICS CORP., Taichung (TW)

(*) Notice: Subject to any disclaimer, the term of this patent is extended or adjusted under 35 U.S.C. 154(b) by 530 days.

(21) Appl. No.: 13/615,063

(22) Filed: Sep. 13, 2012

(65) Prior Publication Data
US 2014/0071770 A1    Mar. 13, 2014

(51) Int. Cl.
| G11C 7/10 | (2006.01) |
| G11C 8/12 | (2006.01) |
| G11C 16/08 | (2006.01) |

(52) U.S. Cl.
CPC .......... *G11C 7/1018* (2013.01); *G11C 7/1045* (2013.01); *G11C 8/12* (2013.01); *G11C 16/08* (2013.01)

(58) Field of Classification Search
CPC .................................. G11C 7/10; G11C 8/12
USPC ........................................ 365/189.02, 230.03
See application file for complete search history.

(56) References Cited

U.S. PATENT DOCUMENTS

| 5,545,555 | A |   | 8/1996 | Lee et al. |
| 5,568,432 | A | * | 10/1996 | Wada ............................ 365/200 |
| 6,118,726 | A |   | 9/2000 | Ji et al. |
| 6,151,271 | A | * | 11/2000 | Lee ........................ 365/230.03 |
| 6,172,893 | B1 |   | 1/2001 | Ryan |
| 6,356,504 | B1 | * | 3/2002 | Kim ........................ 365/230.06 |
| 6,546,503 | B2 | * | 4/2003 | Ooishi ............................. 714/6.2 |
| 6,646,946 | B2 | * | 11/2003 | Tomishima et al. ..... 365/230.03 |
| 6,735,144 | B2 | * | 5/2004 | Maesako et al. ......... 365/230.03 |
| 6,747,898 | B2 |   | 6/2004 | Abedifard |
| 6,889,268 | B2 | * | 5/2005 | Chae et al. ....................... 710/35 |
| 6,941,421 | B2 |   | 9/2005 | Luick |
| 7,054,207 | B2 | * | 5/2006 | Keeth et al. ..................... 365/200 |
| 7,136,316 | B2 | * | 11/2006 | Keeth ............................. 365/201 |
| 7,206,913 | B2 | * | 4/2007 | Hsu et al. ....................... 711/167 |
| 7,333,375 | B2 |   | 2/2008 | Park |
| 8,358,558 | B2 |   | 1/2013 | Lee et al. |
| 2002/0141262 | A1 |   | 10/2002 | Yagishita et al. |
| 2004/0083350 | A1 |   | 4/2004 | Luick |
| 2006/0221730 | A1 |   | 10/2006 | Park |
| 2011/0110176 | A1 |   | 5/2011 | Lee et al. |

FOREIGN PATENT DOCUMENTS

| CN | 1117193 A | 2/1996 |
| CN | 1379410 A | 11/2002 |
| CN | 1499377 A | 5/2004 |
| CN | 1841567 A | 10/2006 |
| CN | 102063934 A | 5/2011 |

* cited by examiner

*Primary Examiner* — Michael Tran
(74) *Attorney, Agent, or Firm* — Finnegan, Henderson, Farabow, Garrett & Dunner LLP

(57) ABSTRACT

A decoder circuit, responsive to a burst sequence control signal, for accessing a memory location in a memory array. The decoder circuit receives an address signal and outputs a plurality of first select lines. Logic circuitry receives these first select lines and a burst sequence control signal and outputs a plurality of second select lines. When the bust sequence control signal is unasserted, the logic circuitry passes through to the plurality of second select lines the signals received on the plurality of first select lines. When the burst sequence control signal is asserted, the logic circuitry performs a logical operation on the signals received on the plurality of first select lines and outputs the result on the plurality of second select lines.

20 Claims, 4 Drawing Sheets

BURST SEQUENCE CONTROL AND MULTI-VALUED FUSE SCHEME IN MEMORY DEVICE

DESCRIPTION OF THE INVENTION

1. Field of the Invention

The present invention relates generally to integrated circuits and, more particularly, to circuitry for accessing a memory location in a memory array.

2. Background of the Invention

Nearly every electronic device today contains some sort of memory, or electronic storage media, for storing data. This memory is typically implemented in hardware using addressable semiconductors, that is, integrated circuits consisting of transistors. There are many different types of memory used in modern electronics, examples including, but not limited to, RAM, ROM, Flash, and EEPROM.

Memory is often organized into a plurality of memory cells. Each memory cell can store a single binary bit (0 or 1) of data. The memory cells are grouped into words of fixed length, such as 1, 2, 4, 8, 16, 32, 64, or 128 bits. Each word can be individually accessed by a binary address. Typically, the memory cells are arranged in an array of rows and columns. During operation, a row is accessed using a row address and then an individual word can be accessed on that row by using a column address corresponding to that word's location within the row. The row and column addresses can be derived from the binary address corresponding to a particular word.

Because the production of memory devices inevitably produces some memory cells which are defective, memory manufacturers often include on the memory device additional substitute memory cells which can be used instead of memory cells that have failed. These substitute cells are typically accessed through a special redundancy logic implemented on the memory device and are not assigned a binary address in the same fashion as the other memory cells. After the memory device has been produced and the defective memory cells identified, fuses included in memory cell access circuitry can be permanently blown to cause a memory access corresponding to a defective memory cell to instead access a permanently assigned substitute memory cell.

A trend in modern electronics is to perform multiple tasks in parallel in order to increase the speed with which operations take place. In the memory context, where memory access time may be a bottleneck, memory operations can be sped up by accessing multiple words from memory at the same time. One way to accomplish this is by implementing a plurality of memory arrays. For example, if zeroth, first, second, and third memory arrays are used, then data could be arranged such that a zeroth word is stored in the zeroth array, a first word in the first array, a second word in the second array, and a third word in the third array. In this arrangement, four words can be read in the same amount of time as one word.

In this arrangement, whenever an access of one word from one array was desired, additional words from the other arrays in the plurality of arrays would also be accessed. Because the operations are performed in parallel, the time to access the plurality of words from the plurality of arrays would be the same as the time to access a single word accessed from one of the memory arrays. Accordingly, even if the extra words accessed from the other memory arrays of the plurality of memory arrays are not needed, there will be no significant performance penalty for performing those extra accesses.

SUMMARY OF THE INVENTION

According to a first aspect of the present disclosure, there is provided a decoder circuit, responsive to a burst sequence control signal, for accessing a memory location in a memory array through a plurality of second select lines, comprising: a decoder circuit coupled to receive an address signal and coupled to a plurality of first select lines; a logic circuit coupled to the plurality of first select lines and to receive the burst sequence control signal and coupled to the plurality of second select lines; wherein, in response to an unasserted burst sequence control signal, the logic circuit outputs on the second select lines a signal received on the first select lines; and, wherein, in response to an asserted burst sequence control signal, the logic circuit outputs on the second select lines the result of a logical operation performed on the signal received on the first select lines.

According to a second aspect of the present disclosure, there is provided a multi-valued fuse circuit, responsive to a burst sequence control signal, for outputting a third signal to a redundancy evaluation circuit corresponding to the address of a defective memory cell, comprising: a fuse circuit to output a first signal; a value generator coupled to receive the first signal and to output at least a second signal; and a multiplexer coupled to receive at least the first signal and the second signal as inputs, the burst sequence control signal as a select input, and to output the third signal.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate multiple embodiments of the invention and together with the description, serve to explain the principles of the invention.

DESCRIPTION OF THE EMBODIMENTS

Reference will now be made in detail to the exemplary embodiments of the invention, examples are illustrated in the accompanying drawings. Wherever possible, the same reference numbers will be used throughout the drawings to refer to the same or like parts.

For the purpose of explanation, each embodiment described below is implemented in a Low Power Double Data Rate 2 (LPDDR2) synchronous dynamic random access memory (SDRAM) device with a burst length of four words four-bit pre-fetch scheme. Those of skill in the art will recognize that embodiments consistent with the invention may also be readily implemented in various memory devices of varying configurations. For example, embodiments consistent with the invention may also be implemented in DDR3, MDDR3, and any other memory device using 4-bit pre-fetch, 8-bit pre-fetch, or any other pre-fetch memory device.

Figure 1:
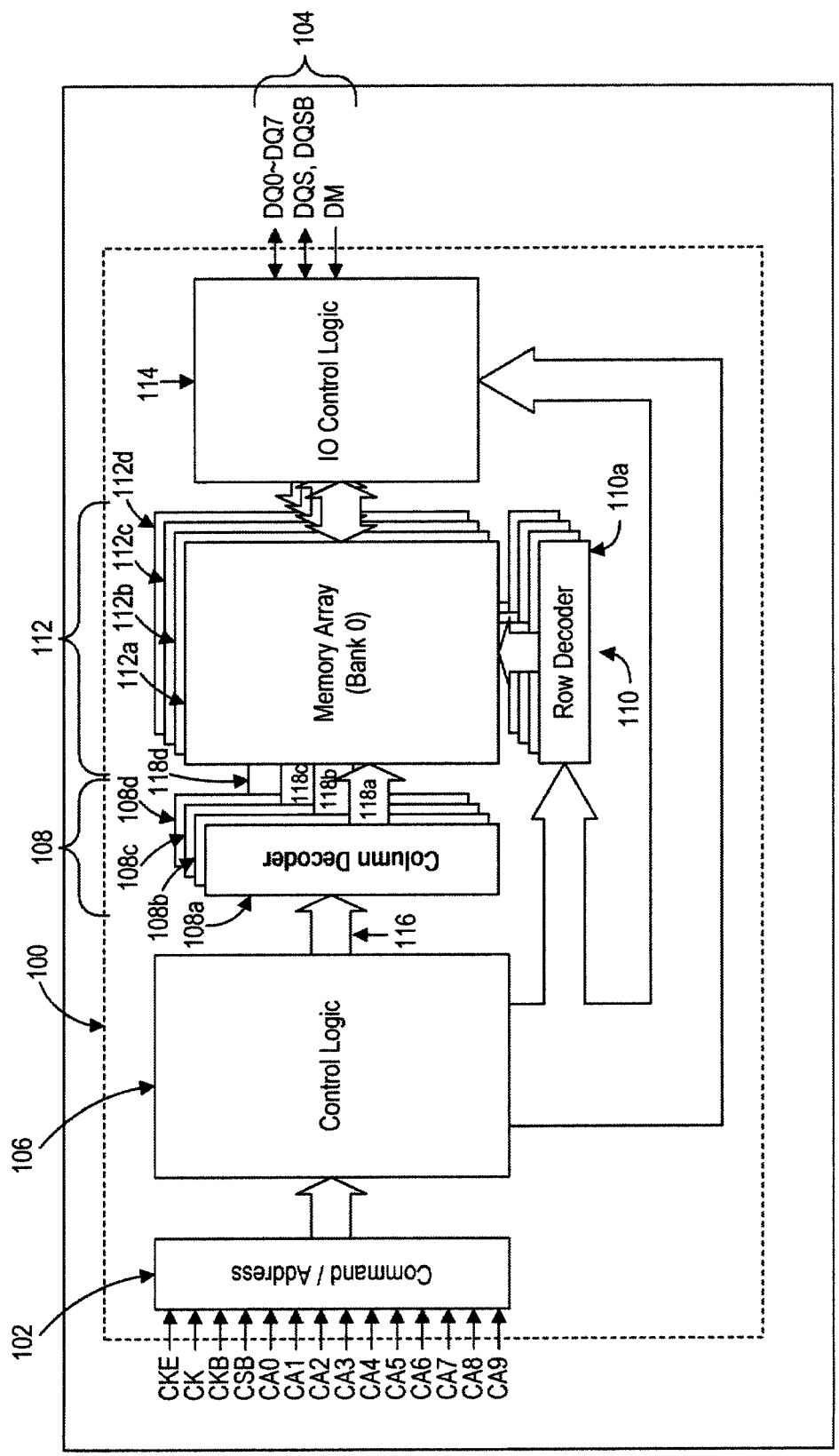
FIG. 1 is a block diagram of an implementation of a memory device.

FIG. 1 is a block diagram of a memory device 100 compliant with the LPDDR2 SDRAM standard and in which embodiments consistent with the present invention may be implemented. The LPDDR2 SDRAM standard is described in more detail in JEDEC document JESD209-2B, February 2010, which is incorporated in its entirety herein by reference. Memory device 100 includes a command interface 102 and a data interface 104 to allow memory read and write accesses. Command interface 102 receives one or more of the following signals: a clock enable signal (CKE); differential clock input signals (CK and CKB); a chip select signal (CSB); and a uni-directional command/address bus input signal (CA9-CA0) which, in this example, contains the column address. Signals 104 input to or output by IO Control 114 include one or more of the following: a bi-directional data signals (DQ7-DQ0); bi-directional and differential data strobe signals (DQS and DQSB); and an input data mask signal for write data (DM). Internally, command interface 102 is coupled to a control logic 106. Control logic 106 is a state machine that manages the internal operation of memory device 100. Control logic 106 outputs a column signal 116 to an array of column decoders 108 (108a, 108b, 108c, 108d) and a row signal to an array of row decoders 110 (110a, 110b, 110c, 110d).

Column decoders 108a, 108b, 108c, 108d receive column signal 116 and output memory array column select signals 118a, 118b, 118c, 118d, respectively, corresponding to one or more particular columns in memory arrays 112a, 112b, 112c, 112d, respectively. Similarly, each row decoder (e.g., row decoder 110a) in the array of row decoders 110 receives the row signal and outputs one or more row select signals corresponding to one or more particular rows in a corresponding memory array (e.g., memory array 112a) within the array of memory arrays 112. The intersection of the selected column and row addresses corresponds to one or more selected memory cells to be accessed for a read or write operation.

For a read operation, the value stored in the selected memory cells of each memory array (e.g., memory array 112a) within the array of memory arrays 112, is output to IO Control Logic 114. IO Control Logic 114 coordinates the actions of memory device 100 with signals 104. For a write operation, IO Control Logic 114 is coupled to receive, from signals 104, the value to be written into the selected memory cell(s) of each memory array (e.g., memory array 112a) within the array of memory arrays 112. As explained above, the present embodiment is described for implementation in a four-bit pre-fetched memory device. Accordingly, the array of column decoders 108 are illustrated as consisting of four column decoders 108a-108d, each of which performs prefetching, coupled to four memory arrays 112a-112d.

Figure 2:
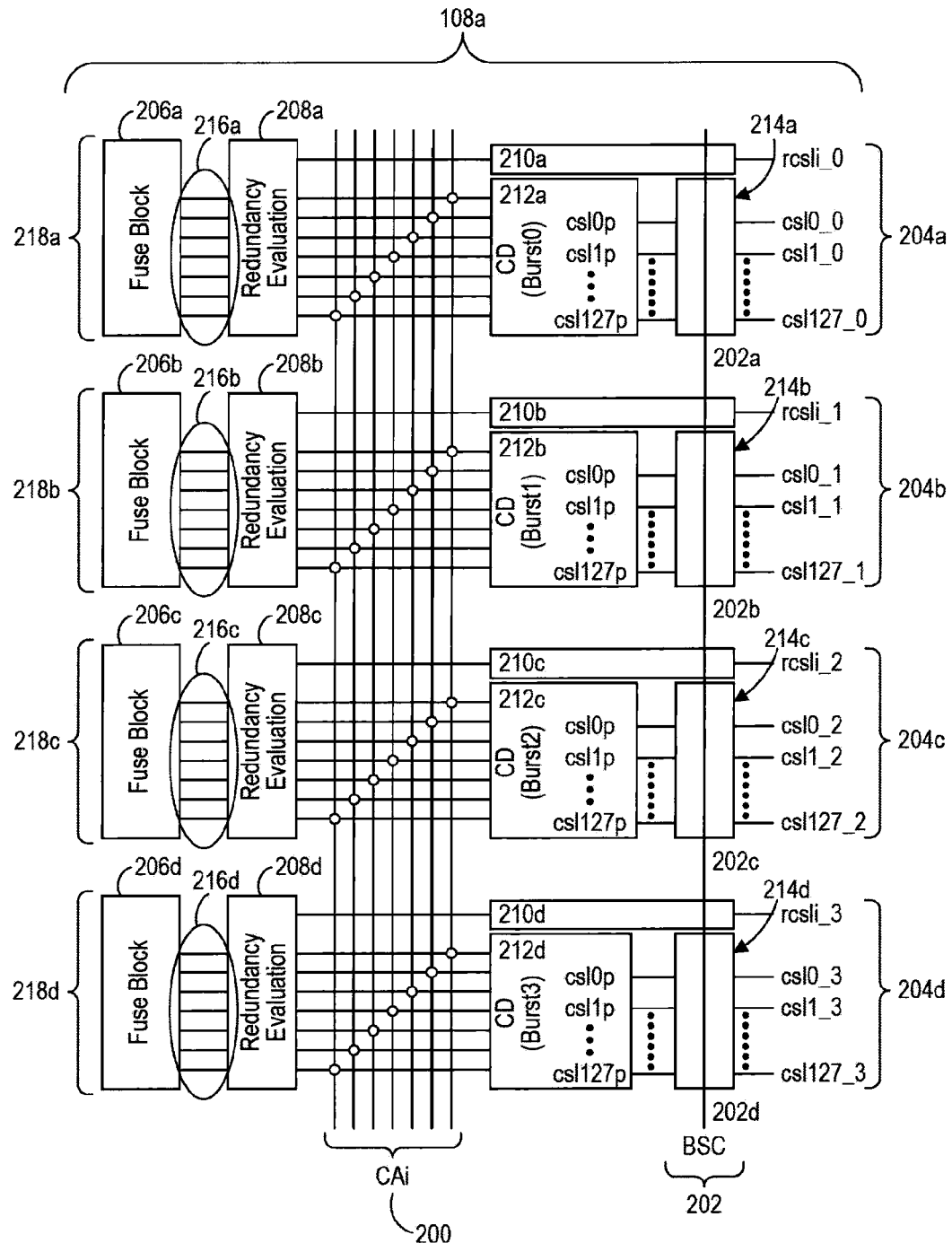
FIG. 2 is a diagram of an embodiment implemented in a column decoder of a memory device.

FIG. 2 is a diagram of an embodiment of a single column decoder (e.g., 108a) implemented in the array of column decoders 108 of memory device 100. Column decoder 108a receives a column address signal 200 and a burst sequence control signal 202. Column decoder 108a outputs column select signals 204a, 204b, 204c, 204d, corresponding to burst column decoders 218a, 218b, 218c, and 218d, respectively.

Internally, column address signal 200 is coupled to each of burst column decoders 218a, 218b, 218c, 218d. Burst column decoders 218a, 218b, 218c, 218d respectively include fuse blocks 206a, 206b, 206c, 206d; redundancy evaluation blocks 208a, 208b, 208c, 208d; redundancy logic blocks 210a, 210b, 210c, 210d; decoders 212a, 212b, 212c, 212d; and column select shift logic blocks 214a, 214b, 214c, 214d. Redundancy evaluation blocks 208a, 208b, 208c, 208d are coupled to receive column address signal 200 and to receive redundancy column address signals 216a, 216b, 216c, 216d from fuse blocks 206a, 206b, 206c, 206d, respectively, and are coupled to redundancy logic blocks 210a, 210b, 210c, 210d, respectively. Decoders 212a, 212b, 212c, 212d are coupled to receive column address signal 200 and are coupled to column select shift logic blocks 214a, 214b, 214c, 214d, respectively. Redundancy logic blocks 210a, 210b, 210c, 210d and column shift logic blocks 214a, 214b, 214c, 214d output column select signals 204a, 204b, 204c, 204d.

Each of decoders 212a, 212b, 212c, 212d is an N-to-$2^n$ decoder that decodes the N-bit address (in this case 7-bit address) received on the column address signal 200 and outputs decoded address signals on $2^n$ select lines (in this case 128 lines) to the column select shift logic block (214a, 214b, 214c, 214d). Although an N-to-$2^n$ decoder is used in this example, embodiments consistent with the present disclosure need not be limited to a particular decoder. Because decoders 212a-212d are N-to-$2^n$ decoders, only one of the 128 ($2^7$) column select lines will be asserted. Column select shift logic blocks 214a, 214b, 214c, 214d output the signal received from decoders 212a, 212b, 212c, 212d, respectively, or, in response to burst sequence control ("BSC") signals 202a, 202b, 202c, 202d, perform a left shift operation on the signal received from decoders 212a, 212b, 212c, 212d and output the result. BSC signals 202a, 202b, 202c, 202d may be generated from within the memory device 100, for example, by control logic 106 and passed to column decoders as part of column signal 116. BSC signals 202a, 202b, 202c, and 202d may be generated as a function of the desired burst type or burst length of the memory device, or the starting address. Alternative embodiments consistent with the present disclosure can utilize more or less than four BSC signals, as desired; may implement BSC signals as a function of other control signals consistent with the present disclosure; and may generate the BSC signal outside of control logic 106. Furthermore, column select signals 204a, 204b, 204c, 204d are output to and received by a single memory array (e.g., 112a) and comprise a memory array column select signal (e.g., 118a).

Fuse blocks 206a, 206b, 206c, 206d output to redundancy evaluation blocks 208a, 208b, 208c, 208d, respectively, an address corresponding to a defective memory cell. Each of the redundancy evaluation blocks 208a, 208b, 208c, 208d functions as a comparator by comparing the memory address received from its corresponding fuse block 206a, 206b, 206c, 206d to the address on the column address signal 200. When the redundancy evaluation block 208a, 208b, 208c, 208d finds a match, it sends a signal to its corresponding respective redundancy logic block 210a, 210b, 210c, 210d indicating that the address location on the column address signal 200 refers to a defective memory cell. Fuse blocks 206a, 206b, 206c, 206d are described in greater detail in FIG. 3.

There are a variety of ways known in the art to implement redundancy logic blocks (210a, 210b, 210c, 210d) and a particular implementation of a redundancy logic block is not an aspect of the present disclosure. For the sake of completeness, each redundancy logic block (210a, 210b, 210c, 210d), upon receiving an asserted signal from its respective redundancy evaluation block (208a, 208b, 208c, 208d), ensures that a defective memory cell is not read and that, instead, the associated redundant memory cell corresponding to that particular defective memory cell is read. The purpose of the redundancy logic block is to redirect accesses to a defective memory cell(s) to a redundant (and non-defective) memory cell(s). The redundancy logic block keeps track of the mapping of defective memory cells to redundant memory cells. Those of skill in the art will now recognize that decisions of how many redundant memory cells to provide and how to implement the redundancy logic blocks are dictated by design considerations.

Following is an example of the operation of the present embodiment. For simplicity, the following example illustrates a read operation, although one of skill in the art will appreciate that a write operation can be performed in a similar manner. In this example, a read is desired at the memory location with a corresponding column address of $00000101_2$ ($10_{10}$). Because each column decoder (108a, 108b, 108c, 108d) includes four burst column decoders (218a, 218b, 218c, 218d), each column decoder (108a, 108b, 108c, 108d) can access four memory cells from its respective memory array (112a, 112b, 112c, 112d). These four memory cells share a truncated column address. The memory cells corresponding to the bits stored at column addresses $00000100_2$ ($8_{10}$)-$00000101_2$ ($11_{10}$) have the same truncated address of $0000010_2$. Thus, when reading these four memory cells, column address signal 200 is $0000010_2$. Accordingly, each memory array (e.g., 112a) can be logically divided into fourths and receives 512 (=128*4) column select signals corresponding to column select signals 204a, 204b, 204c, 204d from its respective column decoder (e.g., 108a).

Continuing with the example, a read operation can be performed that spans two truncated addresses. In this example, a memory read is carried out starting at a memory cell located at column address $00000101_2$ ($10_{10}$) and the memory device implements a burst length of 4, with defective memory cells located at column addresses $00000101_2$ ($11_{10}$) and $00000110_2$ ($13_{10}$). Accordingly, in this example the bits stored in memory cells with addresses $10_{10}$, $11_{10}$, $12_{10}$, and $13_{10}$ are read. The bits at memory cells $10_{10}$ and $11_{10}$ share a truncated address of $0000010_2$, whereas the bits at memory cells $12_{10}$ and $13_{10}$ share a truncated address of $0000011_2$, as explained above. In this example, the signal corresponding to $0000010_2$ ($10_2$ having been truncated from the starting column address) is transmitted on column address signal 200. Additionally, burst sequence control signals 202a and 202b are asserted indicating, as further explained below, that memory cells from addresses $12_{10}$, and $13_{10}$ have a different truncated column address than the cell corresponding to column address signal 200. The following function, while explained serially, actually occurs in parallel, i.e., simultaneously.

Redundancy evaluation block 208c compares column address signal 200 to the signal received from fuse block 206c. Because the memory cell at column address $10_{10}$ (with a truncated address of $0000010_2$) is not a defective memory cell, redundancy evaluation block 208c does not find a match between column address signal 200 and the signal from fuse block 206c and sends an unasserted signal to redundancy logic block 210c.

Decoder 212c decodes the seven bit truncated column address ($0000010_2$) into a signal transmitted on $2^7$ column select lines (csl0p, csl1p, . . . , csl127p). Because decoders 212a-212d are N-to-$2^n$ decoders, only one of the 128 ($2^7$) column select lines will be asserted. In this example, the second column select line (csl2p) of decoder 212c is asserted because $0000010_2$, the column address signal 200, is $2_{10}$. Thus, the signal is 000 . . . 0100, wherein there are 125 zeros preceding a 1, followed by 2 zeros. These column select signals are transmitted to column select shift logic block 214c. Because corresponding burst sequence control signal 202c is not asserted, column select shift logic block 214c outputs as column select signal 204c a signal corresponding to the column select signal received on the column select lines (csl0p, csl1p, . . . , csl127p). The resulting signal is still 000 . . . 0100, wherein there are 125 zeros preceding a 1, followed by 2 zeros. Thus, the csl2_2 line is asserted, while the others are not, because this corresponds to the second address in the part of memory array 112a that corresponds to column select signal 204c and contains the memory cell having the address ($00000101_2$ or $10_{10}$).

Redundancy evaluation block 208d compares column address signal 200 (in this case, $0000010_2$) to the signal it receives from fuse block 206d (also, in this case, $0000010_2$). Because memory cell $11_{10}$ is a defective memory cell, redundancy evaluation block 208d finds a match and sends an asserted signal to redundancy logic block 210d. Redundancy logic block 210d will prevent the defective memory cell from being read and will instead cause the value corresponding to memory cell $11_{10}$ to be read from a corresponding redundant memory cell. Redundancy logic blocks are known in the art and no one particular implementation is required by the present disclosure.

Redundancy evaluation block 208a compares column address signal 200 to the signal it receives from fuse block 206a. Because memory cell $12_{10}$ is not a defective memory cell, redundancy evaluation block 208a does not find a match and sends an unasserted signal to redundancy logic block 210a.

Decoder 212a decodes the seven bit truncated address ($0000010_2$) into a signal transmitted on $2^7$ column select lines (csl0p, csl1p, . . . , csl127p), of which the second column select line (csl2p) of decoder 212a is asserted because $0000010_2$, the column address signal 200, is $2_{10}$. Thus, the signal is 000 . . . 0100, wherein there are 125 zeros preceding a 1, followed by 2 zeros. These column select lines are transmitted to column select shift logic block 214a. Because corresponding burst sequence control signal 202a is asserted, column select shift logic block 214a performs a left shift operation on the output from decoder 212a and outputs the result as column select signal 204a. The resulting signal is 000 . . . 01000, wherein there are 124 zeros, then a 1, then three zeros. Thus, the csl3_0 line is asserted, while the other lines are not, because this corresponds to the third address in the part of memory array 112a that corresponds to column select signal 204a and contains the memory cell having the column address ($00000110_2$ or $12_{10}$).

Redundancy evaluation block 208b compares column address signal 200, ($0000010_2$), to the signal it receives from fuse block 206b. In this case, for reasons which are explained below in connection with FIGS. 3a and 3b, redundancy evaluation block receives signal $0000010_2$ from fuse block 206b. Because memory cell $13_{10}$ (stored in the $0000011_2$ truncated address of memory array 112a associated with column selection signal 204b) is a defective memory cell, redundancy evaluation block 208b finds a match between column address signal 200 and the signal from fuse block 206b and sends an asserted signal to redundancy logic block 210b. Redundancy logic block 210b prevents an access of the defective memory cell at the $0000011_2$ address of memory array 112a associated with column selection signal 204b and instead causes the value associated with memory cell $13_{10}$ to be read from its corresponding redundant memory cell.

Additional embodiments consistent with the present disclosure may also be implemented using various burst lengths and wrap around modes. For example, if the memory device is set for wrap around mode and burst length of four, then burst control signal 202a, 202b, 202c, and 202d will not be asserted. In that example, the shifting logic of column select shift logic block 214a, 214b, 214c, 214d will be bypassed (not left shifted) and column selection signal 204a, 204b, 204c, and 204d, using a starting column address of $10_{10}$, would be $10_{10}$, $11_{10}$, $8_{10}$, and $9_{10}$, respectively. This stands in contrast to the example detailed above where column selection signal 204a, 204b, 204c, and 204d were $10_{10}$, $11_{10}$, $12_{10}$, and $13_{10}$, respectively.

Figure 3A:
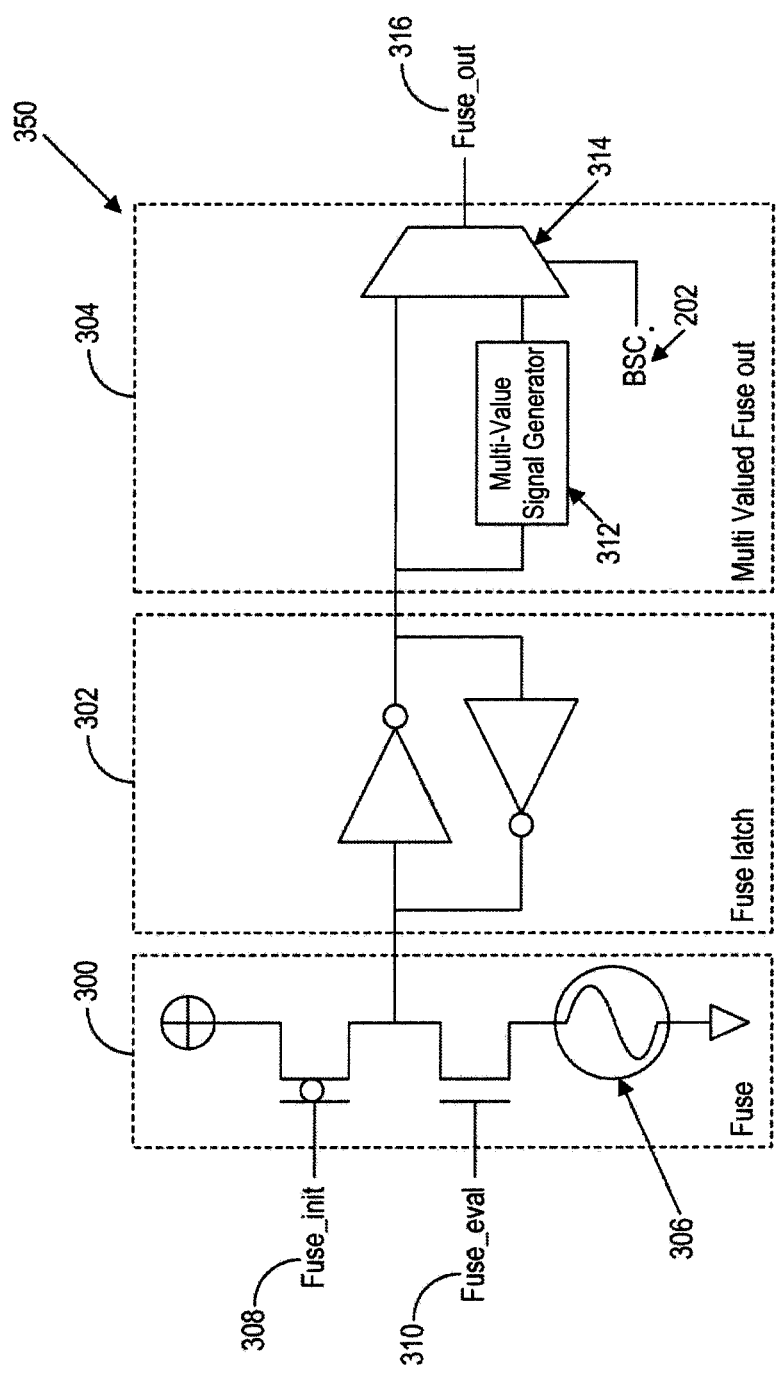
FIG. 3a is a diagram of an embodiment implemented in a fuse unit of a memory device.
Figure 3B:
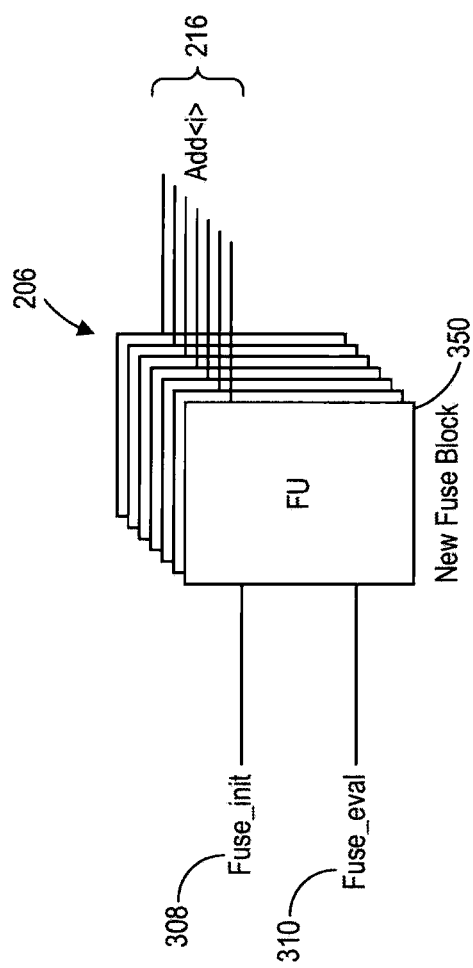
FIG. 3b is a diagram of an embodiment implemented in a fuse block of a memory device.

FIG. 3a is a diagram of an embodiment of a fuse unit 350, which can be connected, according to FIG. 3b, to implement fuse block 206a, 206b, 206c, 206d of memory device 100. Each fuse unit 350 contains a fuse component 300 coupled to a fuse latch 302 which is coupled to a value generator 304. Fuse component 300 contains a fuse 306 and is coupled to receive input signals fuse_init 308 and fuse_eval 310. Value generator 304 includes a multi-value (MV) signal generator 312 and a multiplexer 314, is coupled to receive as input the value stored in fuse latch 302 and burst sequence control (BSC) signal 202, and outputs signal fuse_out 316.

Fuse_init signal 308 is asserted when memory device 100 is powered on. Once the memory device is fully powered on and ready, fuse_eval signal 310 is asserted. When fuse_init signal 308 signal is asserted, this initializes fuse latch 302 and latches binary 1 in fuse latch 302. When fuse_eval signal 310 is asserted, a value corresponding to the status of fuse 306 is latched in fuse latch 302. If fuse 306 is blown, then binary 1 remains and it is latched in fuse latch 302. If fuse 306 is not blown, then binary 0 remains and it is latched in fuse latch 302. Those of skill in the art will understand that fuse component 300 and fuse latch 302 may be implemented in any number of possible ways. Value generator 304 receives as input the value stored in fuse latch 302. In response to burst sequence control signal 202, value generator 304 outputs either the value stored in latch 302 or the output from the MV signal generator 312. The MV signal generator 312 can be used to generate any signal, but in the present embodiment it is implemented as a one down counter. Signal fuse_out 316 corresponds to one bit of a memory address corresponding to a defective memory cell.

FIG. 3b is a diagram of an embodiment implemented in a fuse block (206a, 206b, 206c, 206d) of memory device 100. Multiple fuse units 350 can be coupled together, as shown in FIG. 3b, to create a single fuse block 206 such as those implemented in FIG. 2 as any of fuse blocks 206a, 206b, 206c, and 206d. In such configuration, fuse block 206 outputs a redundancy column address signal 216 such as address signals 216a, 216b, 216c, 216d in FIG. 2. The fuse_init signal 308 and fuse_eval 310 signal from each fuse unit 350 are tied together across all fuse blocks 206a, 206b, 206c, 206d. Additionally, there need not be one MV signal generator for each fuse unit 350. Alternative arrangements may utilize one MV signal generator for each fuse block 206, one MV signal generator shared by every fuse block 206, or an intermediate arrangement. The output from fuse block 206 corresponds to the truncated column address of a defective memory cell.

Two examples, consistent with the example above in connection with FIG. 2, are provided to demonstrate the operation of the present embodiment. In these examples, a memory read of the bits stored in memory cells with addresses $10_{10}$, $11_{10}$, $12_{10}$, and $13_{10}$ is desired and the memory cells having an address of $11_{10}$ and $13_{10}$ are defective memory cells.

In the first example, fuse block 206 in FIG. 3b corresponds to fuse block 206d in FIG. 2 and burst sequence control signal 202 in FIG. 3a corresponds to signal 202d in FIG. 2. Fuse block 206d contains seven fuse units 350 because the truncated column address is seven bits long. The example assumes that the memory cell with an address of $11_{10}$ is defective and that this defective memory cell is stored within the part of memory array 112a corresponding to burst column decoder 218d. Accordingly, the truncated column address of this memory cell will be $0000010_2$ and fuse 306 of fuse block 206d corresponding to the second least significant bit, is blown. As stated in the example above, burst sequence control signal 202d is not asserted, thus redundancy column address signal 216d corresponds to the state of the fuses and since one is blown, column address signal 216d is $0000010_2$.

In the second example, fuse block 206 in FIG. 3b corresponds to fuse block 206b in FIG. 2 and burst sequence control signal 202 in FIG. 3a corresponds to signal 202b in FIG. 2. Fuse block 206b also contains seven fuse units 350 because the truncated column address is seven bits long. Because the example assumes that the memory cell with an address of $13_{10}$ is defective, and because this memory cell is stored within memory array 112a with a truncated column address of $0000011_2$, fuse 306 in fuse unit 350 corresponding to the least significant bit of the column address is blown and, similarly, fuse 306 in fuse unit 350 corresponding to the second least significant bit of the column address is blown, while the remaining fuses 306 of fuse units 350 of fuse block 206b are left unblown. Thus, if the burst sequence control signal 202b is not asserted, redundancy column address signal 216b corresponds to the state of the fuses 306 of fuse block 206b and since two are blown, column address signal 216b is $0000011_2$. However, as stated in the example above, burst sequence control signal 202b is asserted, thus redundancy column address signal 216b corresponds to the output of the MV signal generator 312. The present embodiment implements signal generator 312 as performing a one down counter operation on the signal corresponding to the state of fuses 306. The signal corresponding to the state of the fuses 306 of fuse block 206b is $0000011_2$ and a one down counter operation performed on this signal is $0000010_2$. Thus the output from signal generator 312 would be $0000010_2$ and, accordingly, column address signal 216b is $0000010_2$.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A decoder circuit, responsive to a burst sequence control signal, for accessing a memory location in a memory array through a plurality of second select lines, comprising:
   a decoder circuit coupled to receive an address signal and coupled to a plurality of first select lines;
   a logic circuit coupled to the plurality of first select lines and to receive the burst sequence control signal and coupled to the plurality of second select lines;
   wherein, in response to an unasserted burst sequence control signal, the logic circuit outputs on the second select lines a signal received on the first select lines; and,
   wherein, in response to an asserted burst sequence control signal, the logic circuit outputs on the second select lines the result of a logical shift operation performed on the signal received on the first select lines.

2. The decoder circuit of claim 1, wherein the decoder circuit is a column decoder circuit.

3. The decoder circuit of claim 1, wherein the decoder circuit is a row decoder circuit.

4. The decoder circuit of claim 1, wherein the logical shift operation is a logical shift left by 1 operation.

5. The decoder circuit of claim 1, wherein the logical shift operation is a logical shift left by n operation, wherein n is an integer greater than 1.

6. The decoder circuit of claim 1, wherein the logical shift operation is a logical shift right by 1 operation.

7. The decoder circuit of claim 1, wherein the logical shift operation is a logical shift right by n operation, wherein n is an integer greater than 1.

8. A memory device comprising:
n decoder circuits of claim 1;
wherein n is an integer greater than 1;
wherein the burst sequence control signal is shared among at least two decoder circuits; and
wherein the address signal is shared among at least two decoder circuits.

9. A multi-valued fuse circuit, responsive to a burst sequence control signal, for outputting a third signal to a redundancy evaluation circuit corresponding to the address of a defective memory cell, comprising:
a fuse circuit to output a first signal;
a value generator coupled to receive the first signal and to output at least a second signal; and
a multiplexer coupled to receive at least the first signal and the second signal as inputs, the burst sequence control signal as a select input, and to output the third signal.

10. The multi-valued fuse circuit of claim 9, wherein the fuse is an electrical fuse.

11. The multi-valued fuse circuit of claim 9, wherein the fuse is a physical fuse.

12. The multi-valued fuse circuit of claim 9, wherein the value generator performs a one-down count operation on the received first signal and outputs the result as the second signal.

13. The multi-valued fuse circuit of claim 9, wherein the value generator performs a one-up count operation on the received first signal and outputs the result as the second signal.

14. The multi-valued fuse circuit of claim 9,
wherein the value generator performs logical shift right by n operation on the received first signal;
wherein n is an integer, positive or negative, including zero; and
wherein the result of the logical operation performed on the received first signal is output as the second signal.

15. The multi-valued fuse circuit of claim 9,
wherein the value generator outputs a second signal, which is a function of the received first signal.

16. The multi-valued fuse circuit of claim 9,
wherein the value generator outputs a predefined second signal, independent from the received first signal.

17. The multi-valued fuse circuit of claim 9,
wherein the value generator outputs a second signal as a function of the received first signal and the received burst sequence control signal.

18. The multi-valued fuse circuit of claim 9,
wherein the value generator outputs, in addition to the second signal, n additional signals wherein n is an integer greater than or equal to 1.

19. The multi-valued fuse circuit of claim 9,
wherein the multiplexer is capable of receiving, as inputs, n signals;
wherein n is an integer greater than or equal to 2; and,
wherein the burst sequence control signal is capable of selecting between one of n signals as the output of the multiplexer.

20. A memory device, comprising
a decoder circuit, responsive to a burst sequence control signal, for accessing a memory location in a memory array through a plurality of second select lines, comprising:
a decoder circuit coupled to receive an address signal and coupled to a plurality of first select lines;
a logic circuit coupled to the plurality of first select lines and to receive the burst sequence control signal and coupled to the plurality of second select lines;
wherein, in response to an unasserted burst sequence control signal, the logic circuit outputs on the second select lines a signal received on the first select lines; and,
wherein, in response to an asserted burst sequence control signal, the logic circuit outputs on the second select lines the result of a logical shift operation performed on the signal received on the first select lines; and
a multi-valued fuse circuit, responsive to the burst sequence control signal, for outputting a third signal to a redundancy evaluation circuit corresponding to the address of a defective memory cell, comprising:
a fuse circuit to output a first signal;
a value generator coupled to receive the first signal and to output at least a second signal; and
a multiplexer coupled to receive at least the first signal and the second signal as inputs, the burst sequence control signal as a select input, and to output the third signal.

\* \* \* \* \*